United States Patent [19]

Howell

[11] Patent Number: 4,578,653
[45] Date of Patent: Mar. 25, 1986

[54] FREQUENCY SELECTIVE FILTER CIRCUIT

[75] Inventor: Edward K. Howell, Simsbury, Conn.

[73] Assignee: General Electric Company, Portsmouth, Va.

[21] Appl. No.: 624,154

[22] Filed: Jun. 25, 1984

[51] Int. Cl.$^4$ .................. H03D 3/06; H03D 3/18; H03H 11/04

[52] U.S. Cl. .................. 333/166; 307/520; 328/167; 329/126; 329/128

[58] Field of Search ............... 333/166, 167; 328/165, 328/167; 307/272 R, 272 A, 273, 289–291, 510, 520–522; 329/110, 112, 126, 128, 132–134, 102, 106, 107

[56] References Cited

U.S. PATENT DOCUMENTS

| | | | |
|---|---|---|---|
| 2,947,945 | 8/1960 | Relis et al. | 333/166 X |
| 3,566,263 | 2/1971 | Meers, Jr. | 328/165 X |
| 3,676,699 | 7/1972 | Warren | 307/273 X |
| 3,876,951 | 4/1975 | McLean et al. | 307/273 X |

Primary Examiner—Marvin L. Nussbaum

[57] ABSTRACT

A time domain filter having ideal high pass and low pass characteristics is provided by means of a one-shot monostable multivibrator and a flip-flop interconnected by means of an AND gate and an EXCLUSIVE-OR gate wherein the set time for the one-shot is equal to the half-period of the cut-off frequency. The time domain bandpass filter circuit having ideal bandpass filter characteristics comprises a pair of one-shot monostable multivibrators connected in cascade with each other and interconnected with a flip-flop by means of an AND gate. A further application of a modified time domain filter is that of time domain FM demodulator having an optional phase-locked loop.

11 Claims, 18 Drawing Figures

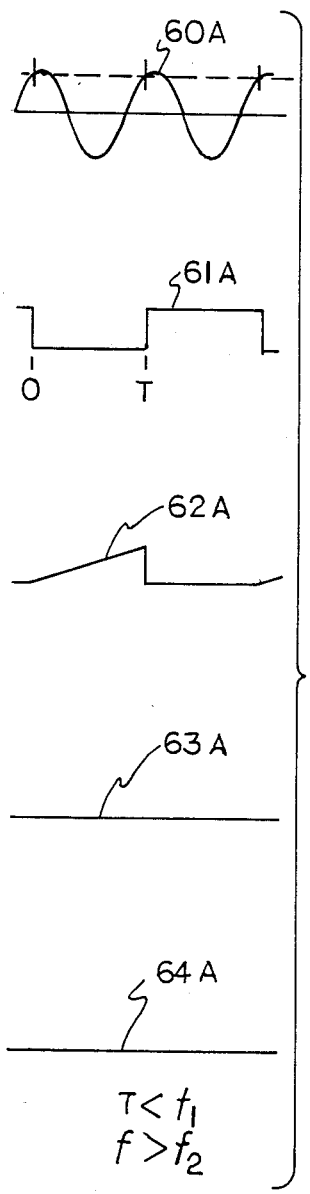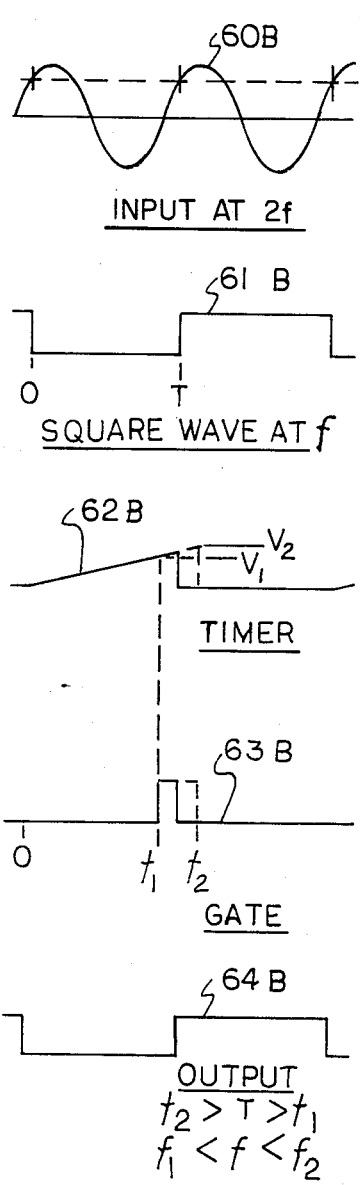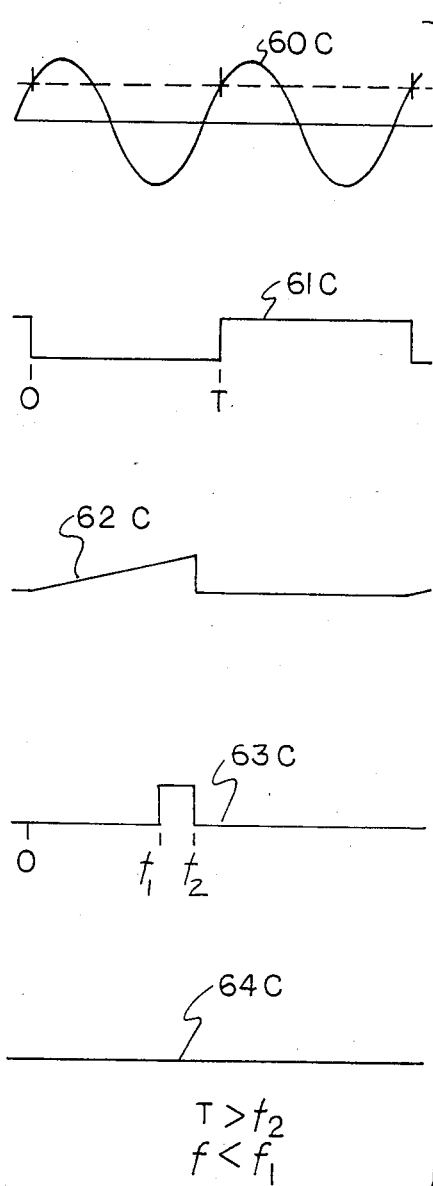

FREQUENCY SELECTIVE FILTER CIRCUIT

BACKGROUND OF THE INVENTION

This invention relates to high pass, low pass and band-pass filters for use within data, FM audio and telephone transceivers. Since all passive-component and most active-component filters include reactive components having frequency-dependent impedance and phase characteristics, and since the reactive components store energy in either magnetic or electrostatic fields, the energy storage results in a memory of previous events such that the filters exhibts a relatively slow response time. The slow response time inherent within state of the art filters results in a sloping frequency response in both amplitude and phase whereas abrupt frequency response and zero phase is required within quality transceivers. One such transceiver is disclosed within U.S. patent application Ser. No. 561,483 filed December 13, 1983 in the name of E. K. Howell. This application is incorporated herein for purposes of reference and provides a detailed description of a digital data transceiver circuit.

The purpose of this invention is to provide a time domain filter wherein the time response is controlled in such a manner that virtually ideal frequency response as well as zero phase conditions are achieved.

SUMMARY OF THE INVENTION

A time domain filter eXhibiting zero phase and abrupt frequency response is provided by the combination of a one-shot monostable multivibrator interconnected with an RS flip-flop by means of an AND gate and an EXCLUSIVE-OR gate having high pass and low pass filter outputs. A time domain bandpass filter is provided by means of two one-shot monostable multivibrators connected in cascade with each other and interconnected with an RS flip-flop by means of an AND gate. A modified time domain filter also provides excellent FM demodulation within radio transceiver circuits.

BRIEF DESCRIPTION OF THE DRAWINGS

FIGS. 10A–10C are graphic representations of the output waveforms for the transceiver time domain bandpass filter and phase-locked FM demodulator depicted in FIG. 9.

DESCRIPTION OF THE PREFERRED EMBODIMENT

The "time domain" filter concept of the instant invention utilizes a time dependent element, such as a monostable multivibrator, to control the frequency response characteristics of the filter. The half-period of the input wave, defined as the time of one-half cycle of the input wave, is used to determine the "on" time of the time dependent element by setting the on time equal to the half-period of a desired cut-off frequency, $f_1$.

Figure 1A:
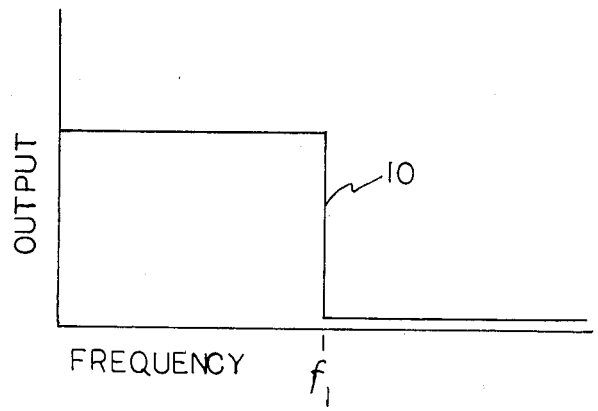
FIGS. 1A–1C are graphic representations of ideal filter output waveforms as a function of input frequency.
Figure 1B:
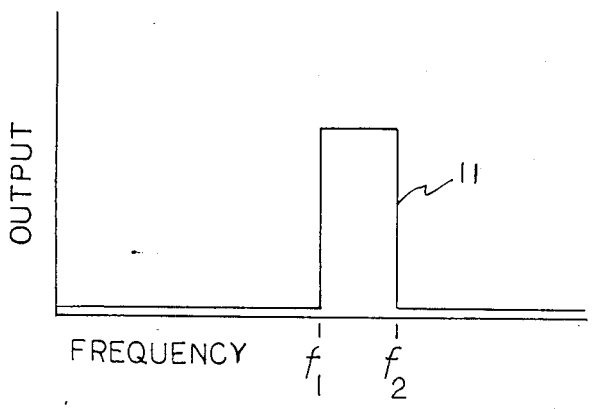
Figure 1C:
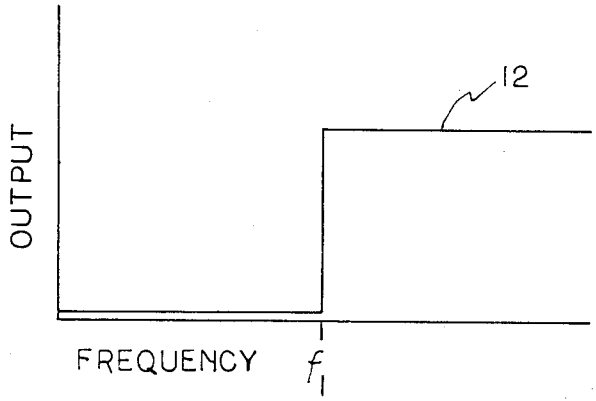

FIGS. 1A–1C show idealized output signal waveforms operating with a square wave input for a low pass waveform 10, a bandpass output waveform 11, wherein the bandpass is defined between $f_1$ and $f_2$, and a high pass waveform 12.

Figure 2:
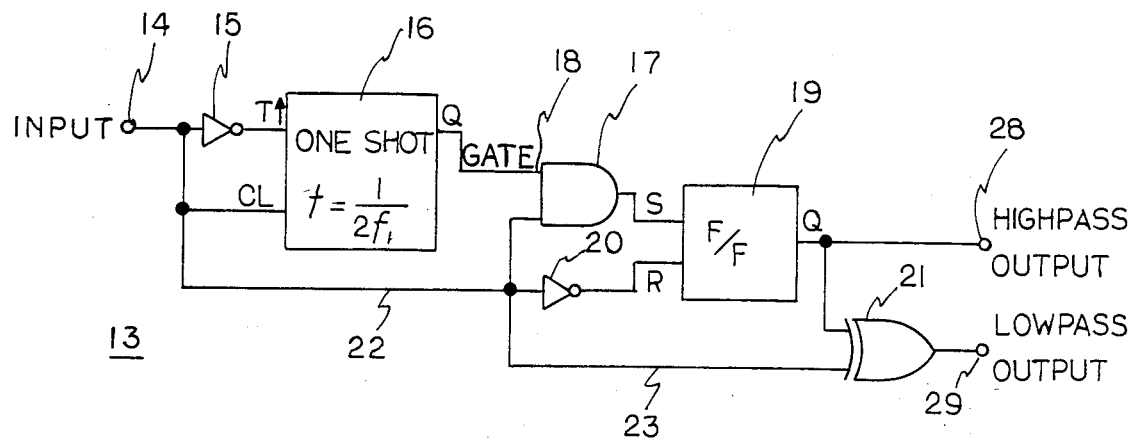
FIG. 2 is a diagrammatic representation of the time domain high pass and low pass filter according to the invention.

One such time domain high pass and low pass filter circuit 13 is depicted in FIG. 2 wherein a signal is applied from the input terminal 14 through an inverter 15 to the TRIGGER input T of a one-shot monostable multivibrator 16. The input signal is directly applied to the CLEAR input CL of the one-shot and through an inverter 20 to the RESET input R of a flip-flop 19 over line 22. The output Q of the one-shot is applied to one input, designated as the GATE input, of an AND gate 17 over line 18. The output of the AND gate is applied to the SET input S of the flip-flop. The output Q terminal of the flip-flop is directly connected to the HIGH PASS output terminal 28 and to one input of an EXCLUSIVE-OR gate 21. The other input to the AND gate is connected in common with the input to inverter 20 via line 22 and to the other input of the EXCLUSIVE-OR gate by means of line 23. The output of the EXCLUSIVE-OR gate is connected to the LOW PASS output 29.

The operation of the time domain high pass and low pass filter circuit 13 is best understood by referring now to FIGS. 3A, 3B and 3C which represent the input waveforms 24A–24C, the gate waveforms 25A–25C, the high pass output waveforms 26A–26C, the low pass output waveforms 27A–27C for frequencies above cut-off, frequency equal to cut-off and frequencies below cut-off, respectively. As described earlier, the on time for the one-shot 16 is set equal to the half-period of the desired cut-off frequency $f_1$ which is defined as $t = 1/2f_1$. When TRIGGER input T goes high, the one-shot output Q goes high and remains high until the preset time elapses or until the CLEAR input CL goes high which resets the timing function. When the input signal at input 14 goes low, the inverter 15 causes the one-shot TRIGGER input T and the GATE input of the AND gate 17 to go high. If the frequency of the input signal is higher than the cut-off frequency $f_1$, the input signal applied directly to the other input of the AND gate 17 goes high while the GATE input is high, assuming a small time lag or propagation delay in response of Q to CL, producing an output from the AND gate to the SET input S setting the flip-flop 19 and causing the HIGH PASS output 28 to go high. The input signal and the HIGH PASS output signal at the HIGH PASS output 28 are applied to the inputs of the EXCLUSIVE-OR gate 21 such that when both inputs are high or low, the LOW PASS output 29 is low. When the input signal goes high, the one-shot is cleared by means of CLEAR input CL. When the input goes low, the flip-flop is reset by means of the RESET input R and both the HIGH PASS output 28 and the LOW PASS output 29 go low.

Besides dependence on the presence or absence of the aforementioned signal voltage, i.e., "high" and "low", at the input terminal 14, the period of the input signal relative to the preset on time of the one-shot 16 is also a determining factor as to the presence or absence of signal voltage at the HIGH PASS output 28 and the LOW PASS output 29 by operation of the one-shot 16. This relation between the set time of the one-shot and the input signal period provides the "time domain" aspect of the filter circuit of the invention. The timing diagrams depicted in FIGS. 3A-3C are represented as the presence (high) or absence (low) of voltage as a function of the frequency of the input signal with respect to the cut-off frequency $f_1$ for each of the voltage-time waveforms depicted. Referring to FIG. 3C for frequencies below cut-off, gate waveform 25C goes low at time $t_0$ before the input waveform 24C goes high at time $t_1$. The flip-flop 19 is not set and the HIGH PASS output 28 remains low as indicated by the high pass output waveform 26C. With the input terminal 14 high and the HIGH PASS output 28 low, the LOW PASS output 29 is high. This is indicated by the low pass output waveform 27C which reproduces the input waveform 24C.

Figures 3A, 3B, 3C:
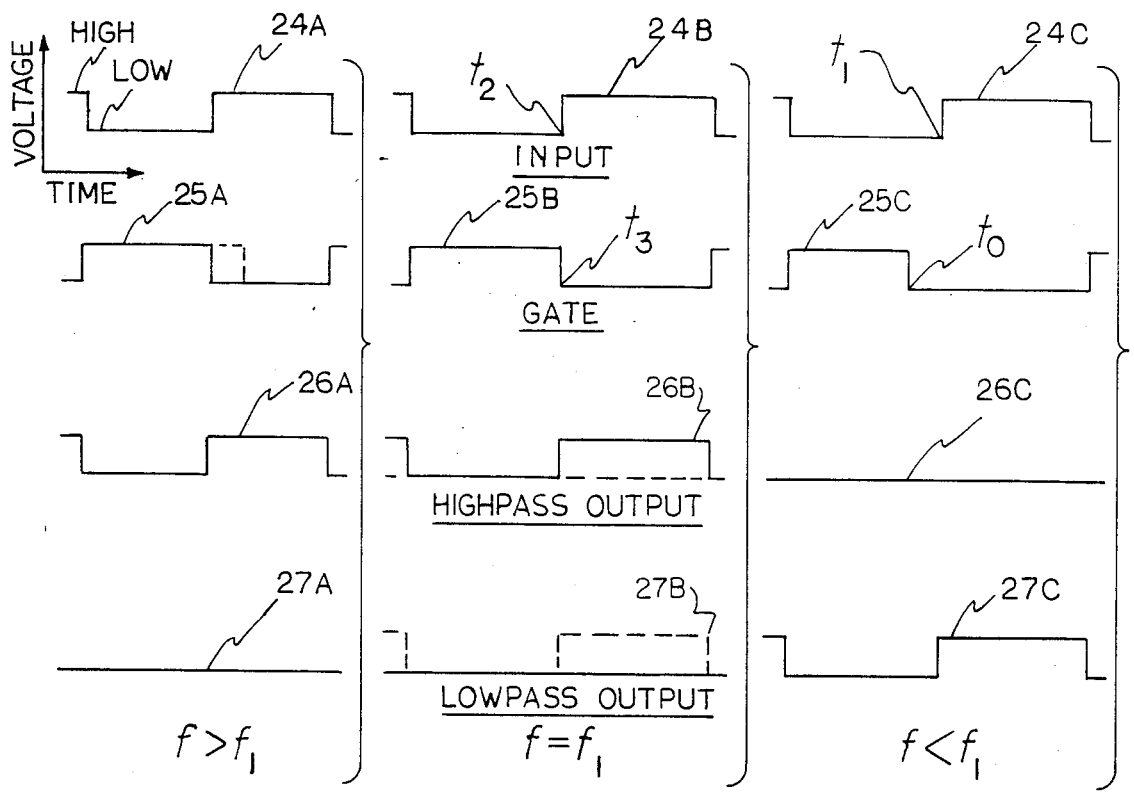
FIGS. 3A–3C are graphic representations of the output waveforms for the time domain filter depicted in FIG. 2.

FIG. 3B represents the timing diagrams for the condition at the HIGH PASS output 28 and the LOW PASS output 29 when the input frequency f is equal to the cut-off frequency $f_1$. For this condition, noise present in the input signal and/or the timing of the one-shot 16 determines which of the outputs 28, 29 is active. This is shown by the dashed lines indicated for the high pass output waveform 26B and the low pass output waveform 27B. A propagation delay between the rise of the input waveform 24B at time $t_2$ and the fall of the gate waveform 25B at time $t_3$ is sufficient to produce an output at the AND gate 17 sufficient to trigger the flip-flop 19. The high pass output waveform 26A and the low pass output waveform 27A shown in FIG. 3A for input frequencies above cut-off are opposite from those described earlier with reference to FIG. 3C for frequencies below cut-off.

Figure 4:
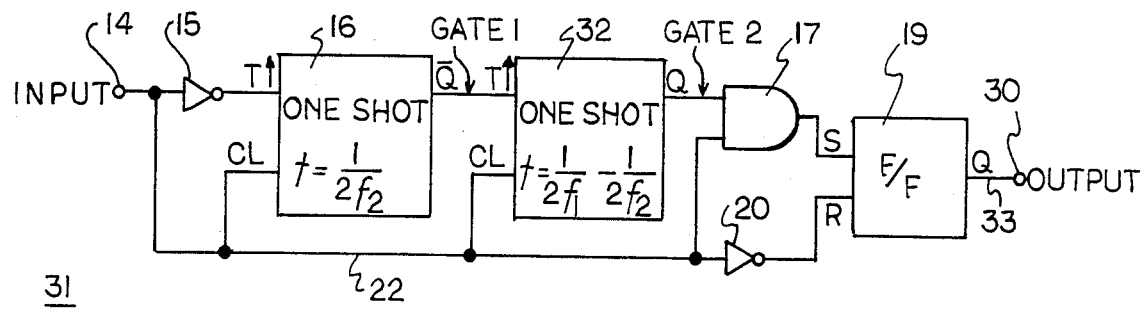
FIG. 4 is a diagrammatic representation of the time domain bandpass filter according to the invention.
Figures 5A, 5B, 5C:
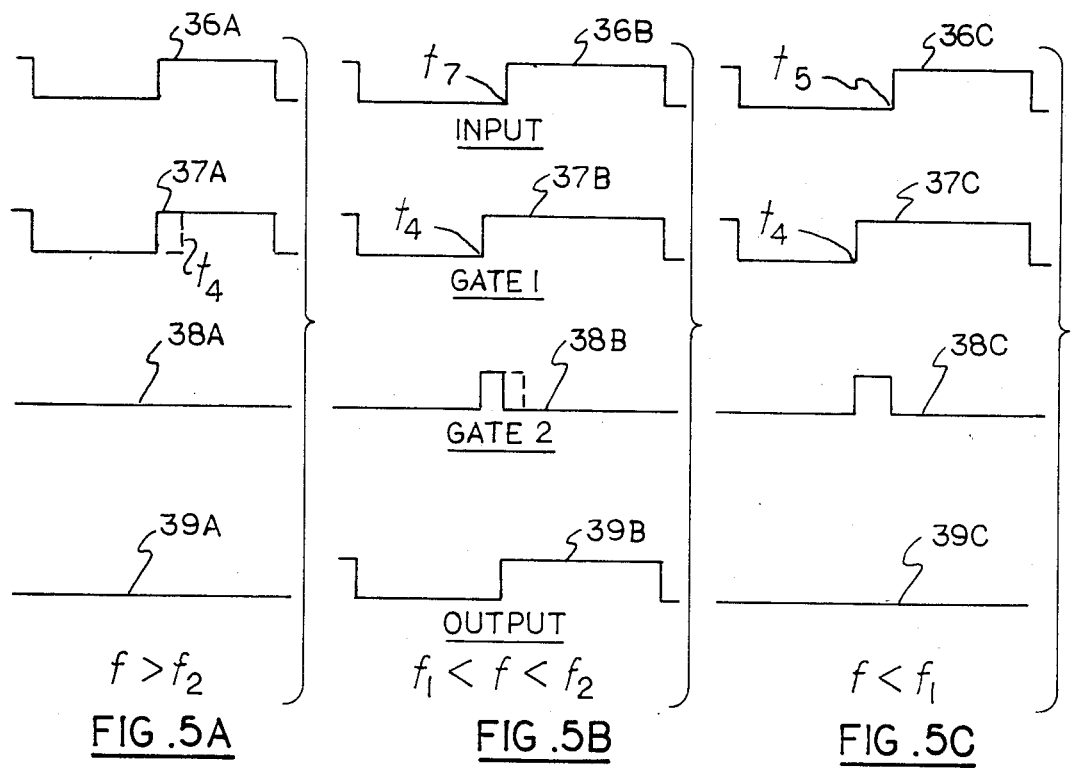
FIGS. 5A–5C are graphic representations of the output waveforms for the time domain bandpass filter depicted in FIG. 4.

A time domain bandpass filter circuit 31 is shown in FIG. 4 and is similar to that described in FIG. 1 for the time domain high pass and low pass filter circuit 13 and similar reference numerals will be employed for common circuit elements. The time domain bandpass filter differs from the time domain high pass and low pass filter by the additional one-shot 32 connected between the one-shot 16 and AND gate 17. The TRIGGER input T of one-shot 32, connected to the output $\overline{Q}$ of the one-shot 16, gates the second one-shot 32 and is hereafter designated as the "gate 1" terminal. The output terminal Q of the second one-shot 32 is connected to the GATE input of the AND gate 17. The GATE input of the AND gate is hereafter referred to as "gate 2". This terminology is helpful in describing the timing diagrams 5A-5C for the time domain bandpass filter waveforms depicted therein. The CLEAR input CL of the second one-shot 32 is connected with line 22. The OUTPUT 30 connected with the output Q of the flip-flop 19 provides the ideal bandpass characteristics depicted in FIGS. 5A-5C. The input waveforms 36A-36C are similar to those described with reference to FIGS. 3A-3C. The gate 1 waveforms 37A-37C are the inverse of those depicted in FIGS. 3A-3C since the gate 1 input TRIGGER T of the second one-shot 32 is connected to the output $\overline{Q}$ of the first one-shot 16 which is the inverse of the Q output of the one-shot within the time domain high pass and low pass filter circuit 13 of FIG. 2. The time domain timing function of the time domain bandpass filter 31 is provided by setting the on time of the one-shot 16 equal to one-half the period of the upper frequency $f_2$ and setting the on time of the second one-shot 32 to the difference between one-half the period of the upper frequency and one-half the period of the lower frequency $f_1$. When the input frequency is less than $f_1$, gate 1 will go high as shown at $t_4$ for waveform 37C before the input waveform 36C goes high at $t_5$. This results in the waveform depicted at 38C appearing at gate 2. For frequencies below the lower cut-off frequency $f_1$, it can be seen by the output waveform 39C that no signal is present. This is also true for frequencies greater than the upper frequency $f_2$ as seen by the absence of signal at the OUTPUT 30 shown at output waveform 39A and by comparing the input, gate 1 and gate 2 waveforms 36A-38A. For frequencies within the bandpass range, that is, less than the upper cut-off frequency $f_2$ and greater than the lower cut-off frequency $f_1$, the gate 1 waveform 37B goes high at $t_4$ before the input waveform 36B goes high at $t_7$. This results in the gate 2 waveform 38B and provides a reproduction of the input waveform occurring at the OUTPUT 30 as shown by the output waveform 39B. It can be seen that by utilizing the second one-shot 32 in combination with one-shot 16, the gate 2 input to gate 17 provides the "window" to produce an output wave if the half-period of the input wave falls within that window. It should be noted that the inverted $\overline{Q}$ output of one-shot 16 is used to trigger the second one-shot 32 at the end of the first timing interval, and that both one-shots 16, 32 are cleared by a high input signal. It is also noted that the OUTPUT 30 is low when the input at 14 is low, and the OUTPUT goes high only when the input goes high in a defined time frame. The presence or absence of an output square wave is thus determined for each cycle of the input square wave without regard to prior events. This is a key feature of the time domain filter concept for providing the ideal frequency response and zero phase conditions as described earlier.

Figure 6:
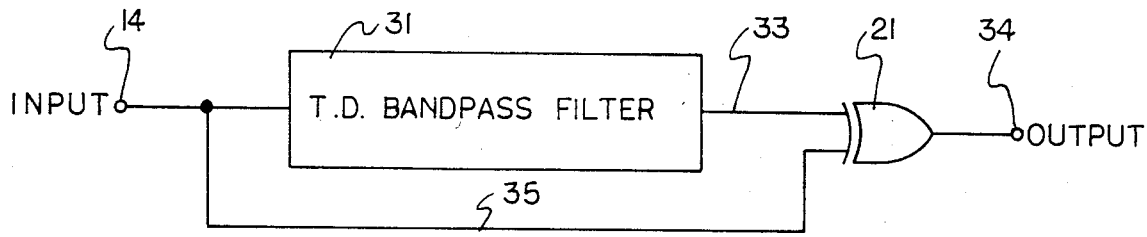
FIG. 6 is a diagrammatic representation of the time domain notch filter according to the invention.

The time domain bandpass filter circuit 31 is converted to a time domain notch filter circuit 40 as shown in FIG. 6 by connecting the output line 33 from the time domain bandpass filter circuit 31 to one input of an EXCLUSIVE-OR gate 21 and by connecting the other input to the input terminal 14 by means of line 35. The output of the EXCLUSIVE-OR gate is directly connected to the OUTPUT 34 as indicated.

Figure 7:
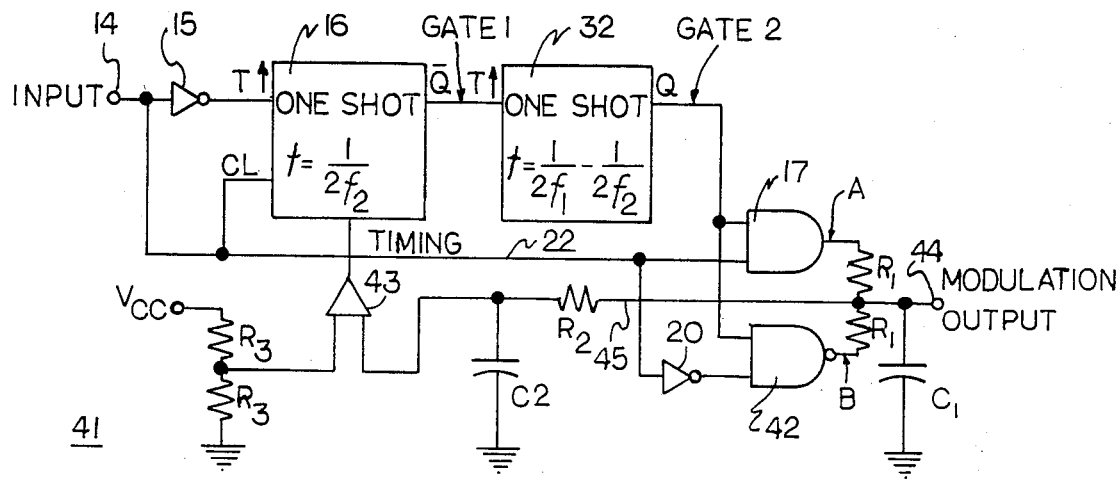
FIG. 7 is a diagrammatic representation of the time domain phase-locked FM demodulator according to the invention.

A time domain phase-locked FM demodulator circuit 41 is shown in FIG. 7. Circuit components similar in function to those within the time domain high pass and low pass filter circuit 13 and the time domain bandpass filter circuit 31 will contain like reference numerals where possible. The arrangement of the one-shot 16 and second one-shot 32 is similar to that within the time domain bandpass filter circuit 31 with respect to the gate 1 and gate 2 terminals. The clear input to the second one-shot 32, however, is omitted. Further, a NAND gate 42 is connected to the gate 2 terminal of AND gate 17 by means of one input and the other input is connected to the output of the inverter 20. The output line A from AND gate 17 is connected with the output line B from the NAND gate 42 through a pair of equivalued resistors $R_1$ which are interconnected with each other and with line 45. The modulation OUTPUT 44 is connected with line 45 and with ground by means of bypass capacitor $C_1$. A differential amplifier 43 is connected with line 45 by means of the low pass filter consisting of resistor $R_2$ and capacitor $C_2$. The output of the differential amplifier is connected to the timing input of one-shot 16. The other input of the differential amplifier is connected to a source of supply voltage $V_{cc}$ and to ground by midpoint connection between a pair of equivalued resistors $R_3$. The operation of the time domain phase-locked FM demodulator 41 is similar to that of the time domain bandpass filter 31 in that a "window" is provided at the gate 2 terminal of the AND gate 17 by the cascade connection between one-shot 16 and one-shot 32. The AND gate 17 in combination with the NAND gate 42 comprises the phase-detector portion of the circuit. The input wave is applied at input terminal 14 and to the other input of the AND gate by means of line 22. The complement of the incoming wave is applied to the other input of the NAND gate through the inverter 20. The output of the two gates appearing on output lines A and B are summed and averaged by the resistors $R_1$ and capacitor $C_1$ to produce an output signal which is a function of the input signal frequency. This provides the demodulation of the input frequency which appears at the modulation OUTPUT 44. If the unmodulated input frequency is midway between the lower cut-off frequency $f_1$ and the upper cut-off frequency $f_2$, or is absent, the voltage appearing at the modulation OUTPUT 44 will be a DC voltage equal to approximately one-half of the supply voltage $V_{cc}$. Increasing the input frequency causes the output voltage to increase until the input frequency $f_{IN}$ equals the upper cut-off frequency $f_2$. The output remains at that higher voltage for input frequencies greater than the upper cut-off frequency $f_2$. Conversely, decreasing the input frequency decreases the output voltage until the input frequency $f_{IN}$ is equal to the lower cut-off frequency $f_1$. The OUTPUT remains at that lower voltage for input frequencies less than the lower cut-off frequency $f_1$. The DC component of the voltage at the modulation OUTPUT 44, as obtained at the output of low pass filter $R_2C_2$ therefore, can be applied to the differential amplifier 43 which is referenced to one-half $V_{cc}$, for example, which in turn applies a timing control signal to one-shot 16 such that, on the average, the positive-going transition of the input signal always occurs approximately at the center of the "window" which comprises the gate 2 pulse. In phase-locked-loop parlance, the "pull-in" range and the "hold-in" range are equal, independent of modulation response, and are both determined solely by the range of control which the differential amplifier 43 can exert upon the timing of one-shot 16. The time domain FM demodulator 41 can operate either in open-loop or closed-loop modes, depending upon the requirements of the application. In the open-loop mode, the DC level of the output can be used as an expanded-scale measurement of the input frequency. The width of the window pulse provided at gate 2, determines the range of input frequency over which the output of the phase detector consisting of the combination of gate 17 and gate 42 is linear.

Figure 8:
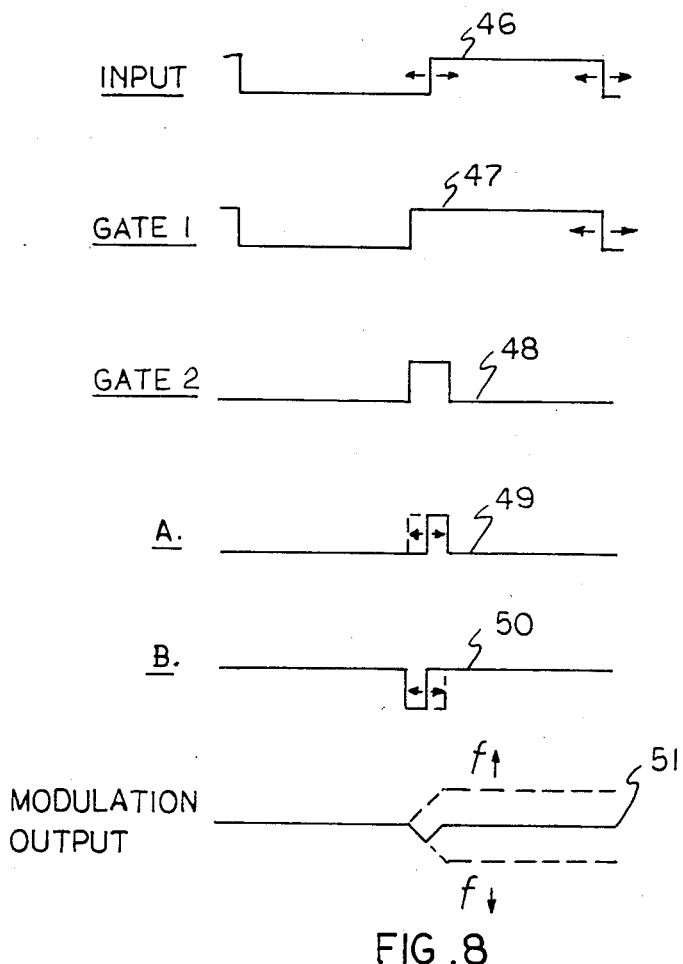
FIG. 8 is a graphic representation of the output waveforms for the time domain phase-locked FM demodulator depicted in FIG. 7.

The waveforms for the FM demodulator 41 of FIG. 7 are shown in FIG. 8. The frequency modulated input square wave has the form depicted at 46. The modulation of the input frequency is depicted by the bidirectional arrows depicted at the transition of the square waves. When the input goes from high to low, the gate 1 waveform 47 also goes from high to low and remains low until the end of the timing interval within one shot 16 at which time the low to high transition takes place. The gate 1 waveform stays high until the input waveform 46 goes low. When the gate 1 waveform goes from low to high, it triggers one shot 32 producing waveform 48 at gate 2 which goes high when triggered and remains high for the on time of the second one shot 32 at which time it then goes low. The waveform 50 appearing at the output B is the complement of waveform 49 appearing at output A. The modulation waveform 51 appearing at the modulation output 44 represents the algebraic addition of both waveforms 49, 50 integrated by capacitor C1. The solid portion of waveform 51 represents the condition wherein the instantaneous input frequency is in the center of the window designated by the gate 2 waveform 48. The dashed waveform represented by the instantaneous frequency f indicated in the upward direction represents the modulation output waveform when the instantaneous frequency is greater than the upper limit of the bandpass. The dashed waveform represented by the instantaneous frequency f indicated in the downward direction represents the modulation output waveform when the instantaneous frequency is less than the lower limit of the bandpass.

All of the described time domain circuits 13, 31 and 41 require a symmetrical square wave input signal since the period of the input wave is estimated to be exactly twice the duration of the low portion of that square wave. If the input signal is derived from a sinusoid, such symmetry is rarely obtained by limiting or clipping techniques because of the effect caused by harmonic distortions, offset biases, etc. A conventional method of obtaining a symmetrical square wave is to use the amplified signal to trigger a master-slave flip-flop circuit, thereby obtaining a square wave at one-half the signal frequency. Time domain processing can then be performed on this (f/2) wave since the half-period of the square wave is then equal to the full period of the signal. Since removal of the input signal can leave the flip-flop output in the high state, it is preferable to couple the flip-flop to the time domain circuit through a high-pass (RC) filter which will restore the "low" state input to the time domain circuit in a reasonably short time after the input signal is removed. This technique is employed in the digital data carrier transceiver circuit disclosed within U.S. patent application Ser. No. 577,947 filed February 8, 1984 in the name of E. K. Howell. This application is incorporated herein for purposes of reference and should be referred to for a detailed description of the transceiver circuit.

Figure 9:
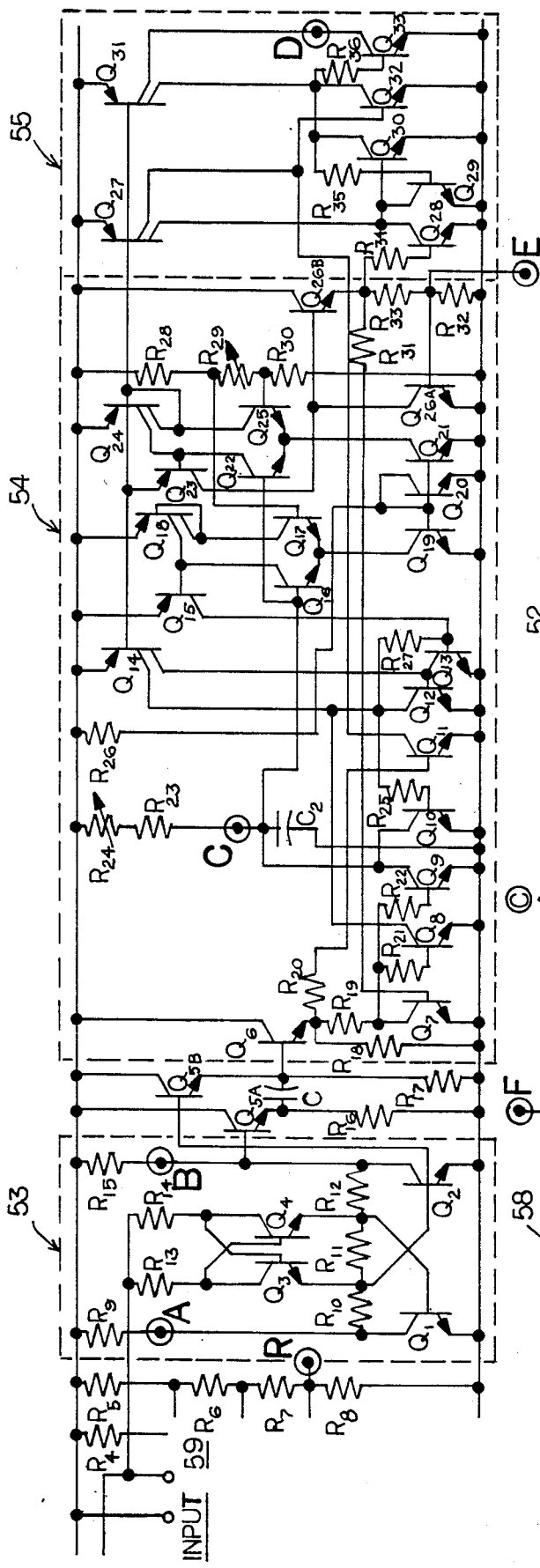
FIG. 9 is a diagrammatic representation of a transceiver time domain bandpass filter and phase-locked FM demodulator according to the invention.
Figure 9:
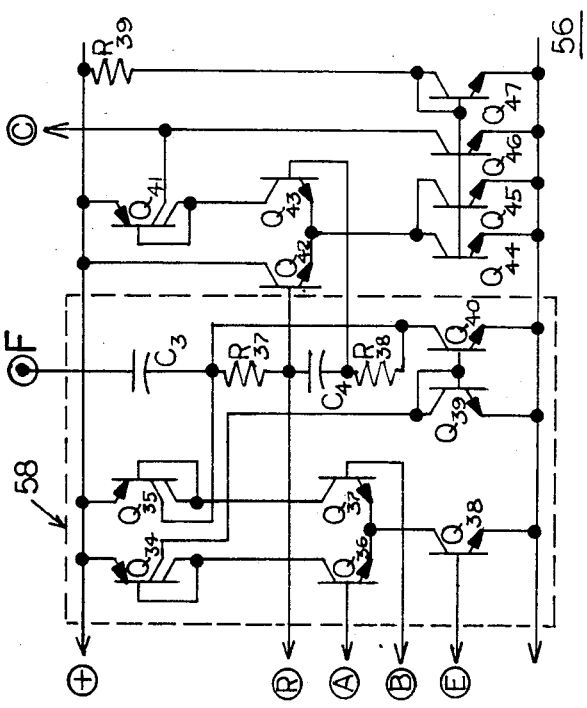

The waveforms depicted in FIG. 10 are those of the detailed circuit implementation of the time domain bandpass filter circuit 52 of FIG. 9 as applied within the aforementioned Howell transceiver circuit.

The incoming signal frequency is halved by a flip-flop 53 which is triggered each time the signal crosses and exceeds an established amplitude threshold. An RC timer circuit 54 is employed within the transceiver circuit in lieu of the two one-shots 16, 32, used within the time domain bandpass filter 31, disclosed herein, to generate a gate pulse window for enabling an output flip-flop 55 similar to the flip-flop 19 in the same aforementioned circuit, to develop the output square wave only when the input frequency is between $f_1$ and $f_2$.

Referring again to the detailed circuit implementation, circuit 52 represents the time domain bandpass filter circuit and circuit 56 represents the phase locked FM demodulator. The signal applied to the input terminal 59 is obtained from an L-C filter and a peak threshold comparator (not shown) to trigger a master-slave flip-flop consisting of resistors $R_9$–$R_{14}$ and transistors $Q_1$–$Q_4$ to produce a square wave of one-half the input frequency, $f \div 2$, at terminals A and B. The output B of the flip-flop 53 is coupled to the timer circuit 54 by means of resistors $R_{16}$–$R_{17}$, transistors $Q_5A$, $Q_5B$ and capacitor $C_1$ which constitutes a high pass filter. The timer circuit 54 consists of resistors $R_{18}$–$R_{33}$, transistors $Q_7$–$Q_{26}$ and capacitor $C_2$. The timing flip-flop consists of resistors $R_{25}$ and $R_{27}$ and transistors $Q_{10}$–$Q_{13}$. The operation of the timer circuit is as follows. The timing capacitor $C_2$ at terminal C is charged through resistors $R_{23}$, $R_{24}$ when the input square wave at terminal B is low. When the capacitor voltage reaches a first threshold, a first comparator consisting of transistors $Q_{22}$, $Q_{25}$ initiates a gate pulse at terminal E. When the capacitor voltage reaches a second threshold, a second comparator $Q_{16}$, $Q_{17}$ sets a timer flip-flop which discharges the capacitor and terminates the gate pulse. The gate pulse is applied to an AND gate consisting of transistors $Q_{28}$ and $Q_{32}$ which sets output flip-flop 55 consisting of resistors $R_{35}$, $R_{36}$ and transistors $Q_{27}$–$Q_{33}$ if the square wave goes high while the gate pulse is high, to produce an output at terminal D. The gate pulse is also applied through resistor $R_{31}$ and transistor $Q_7$ to inhibit the input wave from resetting the timing capacitor $C_2$ and the first flip-flop if the input wave goes high during the gate pulse duration. The gate pulse is also applied to a phase detector circuit 58 within the phase locked FM demodulator circuit 56 to which the square wave from B and its complement from A are also applied. The phase detector 58 comprises the combination of transistors $Q_{34}$–$Q_{40}$ and the audio output is taken from the phase detector at F. The DC component of the audio output is applied through a low pass filter consisting of capacitor $C_4$, resistor $R_{38}$, to a differential amplifier including transistors $Q_{41}$–$Q_{47}$ and resistor $R_{39}$ which adds or subtracts current back to the timer circuit 54 thereby closing the phase locked loop. The phase locked loop correction to the timer circuit is applied at C.

The waveforms associated with the detailed implementation within bandpass filter circuit 52 depicted in FIG. 9 are shown in FIGS. 10A–10C for frequencies greater than the upper cut-off frequency, for frequencies between the upper and lower cut-off frequencies and for frequencies less than the lower cut-off frequency, respectively. The INPUT 59 signal waveforms at twice the filter input frequency for the three conditions are represented by 60A, 60B and 60C. The square wave output of the frequency divider flip flop 53 is the filter input at the signal frequency f, represented by 61A, 61B, 61C which are the same as those depicted in FIGS. 5A–5C for the INPUT waveforms 36A–36C for the same three conditions. The timer waveforms 62A, 62B and 62C exhibit a continuously increasing voltage ramp for frequencies greater than the upper cut-off frequency $f_2$, frequencies between the upper cut-off frequency $f_2$ and the lower cut-off frequency $f_1$ and for frequencies less than the lower cut-off frequency $f_1$. It is noted that for frequencies between the upper cut-off frequency $f_2$ and the lower cut-off frequency $f_1$, the voltage ranges from $V_1$ at $t_1$ to $V_2$ at $t_2$ as indicated. The gate waveforms 63A–63C and the output waveforms 64A–64C are identical to those shown in FIGS. 5A–5C for the gate 2 and output waveforms 38A–38C and 39A–39C. It is further noted that for frequencies greater than the upper cut-off frequency $f_2$, the period T of the square wave waveform 61A at the input wave frequency f, is less than $t_1$. For frequencies below the upper cut-off frequency $f_2$ and above the lower cut-off frequency $f_1$, the period T is greater than $t_1$ and less than $t_2$. For frequencies below the lower cut-off frequency $f_1$, the period T is greater than $t_2$.

I claim:

1. A time domain filter for receiving a symmetrical square wave input signal, said time domain filter comprising in combination:

an input terminal;

a high pass output terminal;

an inverter having an input connected to said input terminal, said inverter having an output;

monostable multivibrator means having a trigger input connected to the output of said inverter, said monostable multivibrator means having an on time which is equal to the half period of a desired low frequency filter cut-off frequency, and said monostable multivibrator means having an output;

an AND gate having one input connected to the output of said multivibrator means and a second input connected to said input terminal, said AND gate having an output, wherein an output from said AND gate is produced when the half wave period of said input signal is less than the on time of said monostable multivibrator means; and bistable multivibrator means having a set input connected to the output of said AND gate, said bistable multivibrator means having an output connected to said high-pass output terminal.

2. The filter of claim 1 further comprising:

a low pass output terminal; and an exclusive OR gate having one input connected to said input terminal and having a second input connected to the output of said bistable multivibrator means, said exclusive OR gate providing a low pass output when the frequency of said input signal is lower than said cut-off frequency.

3. The filter of claim 2 wherein said monostable multivibrator means has a clear input connected to said input terminal and said bistable multivibrator means has a reset input and further comprising a second inverter having an input connected to said input terminal, said second inverter having an output connected to the reset input of said bistable multivibrator means.

4. A time domain frequency band pass filter for receiving a symmetrical square wave input signal and having a low pass cut-off frequency and having a high pass cut-off frequency, said time domain frequency band pass filter comprising in combination;

an input terminal;

an output terminal;

an inverter having an input connected to said input terminal, said inverter having an output;

first monostable multivibrator means having a trigger input connected to the output of said inverter, said first monostable multivibrator means having an on time which is equal to one half of the period of said high pass cut-off frequency, said first monostable multivibrator means having an output;

second monostable multivibrator means having a trigger input connected to the output of said first monostable multivibrator means, said second monostable multivibrator means having an on time which is equal to one half of the period of said low pass cut-off frequency less one half of the period of said high pass cut-off frequency, said second monostable multivibrator means having an output;

an AND gate having one input connected to the output of said second monostable multivibrator means and a second input connected to said input terminal, said AND gate having an output, wherein an output from said AND gate is produced when the half wave period of said input signal is less than the half wave period of said high pass cut-off frequency and greater than said low pass cut-off frequency; and bistable multivibrator means having a set terminal connected to the output of said AND gate and having an output connected to said output terminal.

5. The time domain frequency band pass filter of claim 4 wherein said first and second monostable multivibrator means each have a clear input connected to said input terminal.

6. The filter of claim 5 wherein said bistable multivibrator means has a reset input and further comprising a second inverter having an input connected to said input terminal and having an output connected to the reset input of said bistable multivibrator means.

7. The filter of claim 4 further including an exclusive-OR gate having one input connected to said input terminal and a second input connected to the output of said bistable multivibrator means, said exclusive-OR gate having an output which is connected to said output terminal, wherein said filter output is a frequency selective notch.

8. A frequency selective FM demodulation circuit comprising in combination:
an input terminal;
an output terminal;
an inverter having an input connected to said input terminal, said inverter having an output;
first monostable multivibrator means having a trigger input connected to the output of said inverter, said first monostable multivibrator means having an on time which is equal to one half of the period of a high frequency cut-off, and said first monostable multivibrator means having an output;
second monostable multivibrator means having a trigger input connected to the output of said first monostable multivibrator means, said second monostable multivibrator means having an on time which is equal to one half of the period of a low frequency cut-off less one half of the period of said high frequency cut-off, said second monostable multivibrator means having an output; and phase detector means having one input connected to the output of said second monostable multivibrator means and a second input connected to said input terminal, said phase detector means having an output connected to said modulation output terminal.

9. The demodulation circuit of claim 8 wherein said phase detector means comprises:
an AND gate having one input connected to said input terminal and a second input connected to the output of said second monostable multivibrator means, said first AND gate having an output;
an inverter connected to said input terminal and having an output;
a NAND gate having one input connected to the output of said inverter and a second input connected to the output of said and second monostable multivibrator means, said NAND gate having an output; and
modulation output means having one input connected to the output of said AND gate and a second input connected to the output of said NAND gate for summing and averaging said outputs to provide demodulated frequency signals, said modulation output means having an output connected to said output terminal.

10. The demodulaton circuit of claim 9 wherein said first monostable multivibrator means has a timing input and further comprising phase lock loop means connected between the output of said modulation output means and the timing input of said first monostable multivibrator means for providing closed loop operation for said demodulator circuit.

11. The demodulation circuit of claim 10 wherein said phase lock loop means comprises:
a source of constant voltage
a low pass filter having an input connected to the output of said modulation output means, said low pass filter having an output; and
a differential amplifier having one input connected to said source of constant voltage and a second input connected to the output of said low pass filter, said differential amplifier having an output connected to the timing input of said first monostable multivibrator means to thereby control the timing of said first monostable multivibrator as a function of the difference between the voltage developed at the output of said low pass filter and said constant voltage.

* * * * *